United States Patent
Salimian et al.

(10) Patent No.: US 10,460,941 B2
(45) Date of Patent: Oct. 29, 2019

(54) PLASMA DOPING USING A SOLID DOPANT SOURCE

(71) Applicant: Varian Semiconductor Equipment Associates, Inc., Gloucester, MA (US)

(72) Inventors: Siamak Salimian, Rockport, MA (US); Qi Gao, Stoneham, MA (US); Helen L. Maynard, North Reading, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 69 days.

(21) Appl. No.: 15/459,416

(22) Filed: Mar. 15, 2017

(65) Prior Publication Data

US 2018/0130659 A1    May 10, 2018

Related U.S. Application Data

(60) Provisional application No. 62/419,010, filed on Nov. 8, 2016.

(51) Int. Cl.
*H01L 21/223* (2006.01)
*H01J 37/32* (2006.01)

(52) U.S. Cl.
CPC ...... *H01L 21/2236* (2013.01); *H01J 37/3244* (2013.01); *H01J 37/32422* (2013.01); *H01J 37/32706* (2013.01); *H01J 37/32724* (2013.01); *H01J 37/321* (2013.01); *H01J 2237/3365* (2013.01)

(58) Field of Classification Search
CPC ............ H01L 21/2236; H01L 29/66803; H01J 37/32412; H01J 2237/332
See application file for complete search history.

(56) References Cited

U.S. PATENT DOCUMENTS

| | | | |
|---|---|---|---|
| 8,889,534 B1* | 11/2014 | Ventzek | H01L 21/2236 118/723 MW |
| 9,397,011 B1* | 7/2016 | Fang | H01L 21/02274 |
| 2005/0260354 A1 | 11/2005 | Singh et al. | |
| 2007/0176124 A1* | 8/2007 | Sasaki et al. | C23C 14/48 250/492.21 |
| 2009/0233384 A1 | 9/2009 | Foad et al. | |
| 2010/0200954 A1* | 8/2010 | Del Agua Borniquel | H01L 21/2236 257/607 |

(Continued)

FOREIGN PATENT DOCUMENTS

KR    10-2013-0043337 A    4/2013

OTHER PUBLICATIONS

International Search Report and Written Opinion dated Feb. 9, 2018 in corresponding PCT application No. PCT/US2017/052479.

*Primary Examiner* — Stephen M Bradley
(74) *Attorney, Agent, or Firm* — Nields, Lemack & Frame, LLC (57) ABSTRACT

A method of processing a workpiece is disclosed, where the interior surfaces of the plasma chamber are first coated using a conditioning gas that contains the desired dopant species. A working gas, which does not contain the desired dopant species, is then introduced and energized to form a plasma. This plasma is used to sputter the desired dopant species from the interior surfaces. This dopant species is deposited on the workpiece. A subsequent implant process may then be performed to implant the dopant into the workpiece. The implant process may include a thermal treatment, a knock in mechanism, or both.

20 Claims, 5 Drawing Sheets

(56) References Cited

U.S. PATENT DOCUMENTS

| | | |
|---|---|---|
| 2014/0097487 A1 | 4/2014 | Yen et al. |
| 2015/0024580 A1* | 1/2015 | Kurunczi .............. H01L 21/265 |
| | | 438/514 |

* cited by examiner

PLASMA DOPING USING A SOLID DOPANT SOURCE

This application claims priority to U.S. Provisional Patent Application Ser. No. 62/419,010, filed Nov. 8, 2016, the disclosure of which is herein incorporated by reference in its entirety.

FIELD

Embodiments of the present disclosure relate to methods for doping a workpiece using a solid dopant source, and more particularly, to a method of doping a workpiece using dopant previously deposited on interior surfaces of a plasma chamber.

BACKGROUND

Semiconductor workpieces are often implanted with dopant species to create a desired conductivity. Plasma implantation is an effective method of doping or otherwise modifying surfaces of a semiconductor device. For example, plasma implantation may be effective in doping the vertical surfaces, also referred to as sidewalls.

Many types of emerging semiconductor device structures utilize sidewall modification, including FinFETs, 3D NAND gates, CIS and power devices. In certain embodiments, it may be desirable to modify the sidewalls with low, or even very low, concentrations of dopants or other species.

However, plasma chambers are typically better suited to perform implants with higher dopant concentrations. Precision and repeatability at very low doses may be problematic.

Therefore, a method that allows a precise amount of dopant to be deposited and subsequently implanted into a workpiece, would be beneficial.

SUMMARY

A method of processing a workpiece is disclosed, where the interior surfaces of the plasma chamber are first coated using a conditioning gas that contains the desired dopant species. A working gas, which does not contain the desired dopant species, is then introduced and energized to form a plasma. This plasma is used to sputter the desired dopant species from the interior surfaces. This dopant species is deposited on the workpiece. A subsequent implant process may then be performed to implant the dopant into the workpiece. The implant process may include a thermal treatment, a knock in mechanism, or both.

According to one embodiment, a method of depositing a dopant species on a workpiece is disclosed. The method comprises performing a conditioning process, the conditioning process comprising introducing a conditioning gas into a plasma chamber of an ion source, the conditioning gas comprising a dopant species; and ionizing the conditioning gas in said plasma chamber so as to form a coating, which comprises the dopant species in solid form, on interior surfaces of the plasma chamber; and performing a deposition process after the conditioning process, the deposition process comprising introducing a working gas into the plasma chamber after the coating is formed, wherein the working gas does not comprise the dopant species; and ionizing the working gas in said plasma chamber to create ions and sputter the coating, such that the dopant species is deposited on the workpiece. In certain embodiments, the workpiece is not disposed in the plasma chamber during the conditioning process. In certain embodiments, the working gas comprises an inert gas. The dopant species may be a Group 3 or Group 5 element.

According to another embodiment, a method of implanting a dopant species in a workpiece is disclosed. The method comprises performing a conditioning process, the conditioning process comprising introducing a conditioning gas into a plasma chamber of an ion source, the conditioning gas comprising a dopant species; and ionizing the conditioning gas in said plasma chamber so as to form a coating, which comprises the dopant species in solid form, on interior surfaces of the plasma chamber; sputtering the coating so that the dopant species is deposited on the workpiece; and implanting the dopant species into the workpiece. In certain embodiments, the implanting comprises exposing the workpiece to a thermal treatment. In certain embodiments, the sputtering comprises introducing a working gas into the plasma chamber after the coating is formed, wherein the working gas does not comprise the dopant species; and ionizing the working gas in said plasma chamber to create ions and sputter the coating, such that the dopant species is deposited on the workpiece. In certain embodiments, the implanting comprises negatively biasing the workpiece so as the cause ions of the working gas to drive in the dopant species. In certain further embodiments, the workpiece is exposed to a thermal treatment after the negatively biasing. In some embodiments, a capping layer is deposited on the workpiece prior to exposing the workpiece to the thermal treatment.

According to another embodiment, a method of processing a workpiece is disclosed. The method comprises placing a workpiece in a plasma chamber; and creating a plasma by energizing a working gas in the plasma chamber while the workpiece is disposed in the plasma chamber, wherein the plasma causes dopant species that coated interior surfaces of the plasma chamber to sputter and deposit on the workpiece. In certain further embodiments, the dopant species that is deposited on the workpiece is implanted into the workpiece. The implant process may include a knock in mechanism, a thermal treatment, or both processes.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
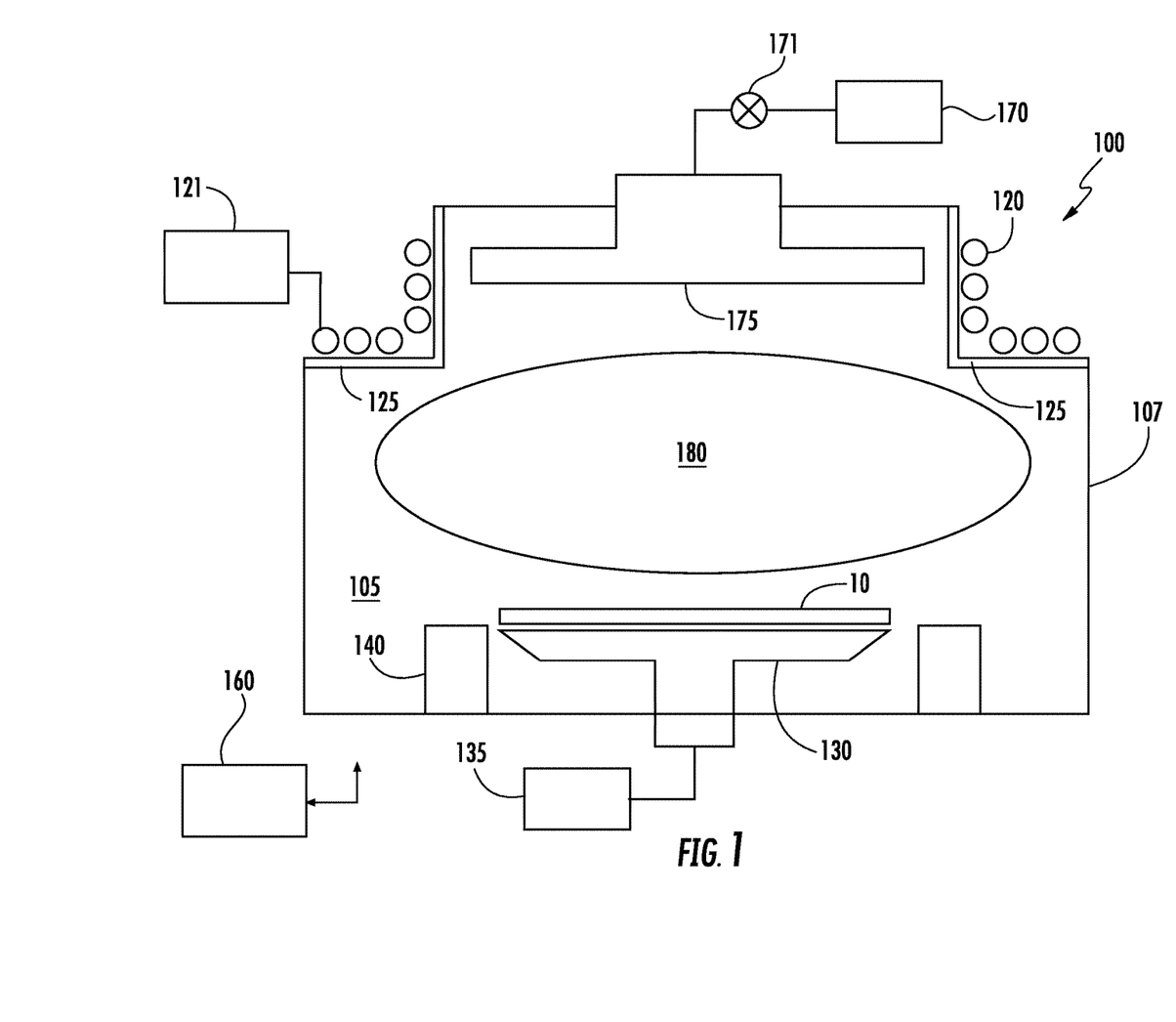
FIG. 1 shows the ion source according to one embodiment.

FIG. 1 shows a cross-section of an embodiment of a plasma chamber 105 of an ion source 100 that may be used with the present disclosure. The ion source 100 includes a plasma chamber 105 defined by several plasma chamber walls 107, which may be constructed from aluminum, graphite or another suitable material. This plasma chamber 105 may be supplied with one or more feedgasses, stored in one or more feedgas containers 170 that enters the plasma chamber 105 via a gas baffle 175. A mass flow controller 171 may be used to regulate the flow of the feedgas into the plasma chamber 105. This feedgas may be energized by an RF antenna 120 or another plasma-generation mechanism. The RF antenna 120 is in electrical communication with a RF power supply 121 which supplies power to the RF antenna 120. A dielectric window 125, such as a quartz or alumina window, may be disposed between the RF antenna 120 and the interior of the plasma chamber 105.

A workpiece 10 is disposed within the plasma chamber 105, on a platen 130. The platen 130 is in electrical communication with a bias power supply 135, which is used to negatively bias the platen 130 during certain time periods so that positive ions are attracted toward the workpiece 10. To protect the platen 130, a shield ring 140 may be disposed around the circumference of the platen 130.

A controller 160 may be in communication with the bias power supply 135 and the mass flow controller 171 that controls the flow of feedgas and working gas into the plasma chamber 105. The controller 160 may include a processing unit, such as a microcontroller, a personal computer, a special purpose controller, or another suitable processing unit. The controller 160 may also include a non-transitory storage element, such as a semiconductor memory, a magnetic memory, or another suitable memory. This non-transitory storage element may contain instructions and other data that allows the controller 160 to perform the functions described herein.

The method of performing these implants, which may be very low dose implants, utilizes several processes. The method begins by performing a conditioning process. A conditioning process is one in which ions of the feedgas are created. However, rather than implanting or directing these ions toward a workpiece, the ions are deposited on the interior surfaces of the plasma chamber 105. In certain embodiments, the conditioning process is performed while the workpiece 10 is not disposed in the plasma chamber 105. In certain embodiments, a "dummy wafer" may be disposed on the platen 130 during the conditioning process to protect the platen 130 from deposition. In other words, the workpiece that is intended to be processed is not disposed in the plasma chamber 105 during the conditioning process.

During the conditioning process, a feedgas is introduced into the plasma chamber 105 from the feedgas container 170. The RF antenna 120 is energized using the RF power supply 121, so as to create a plasma 180 in the plasma chamber 105.

The feedgas includes a dopant species that is intended to be implanted in the workpiece 10. For example, the dopant species may be a Group 3 element, such as boron, a Group 5 element, such as phosphorus or arsenic, or a Group 4 element, such as carbon. The feedgas may be $AsH_3$, $B_2H_6$, $CH_4$ or other species. In certain embodiments, a hydride of the dopant may be utilized. In other embodiments, a halogenated form of the dopant may be used. In certain embodiments, the feedgas is selected such that at least one monolayer is deposited on the interior surfaces of the plasma chamber 105.

The molecules of the feedgas may be deposited on one or more of the various interior surfaces of the plasma chamber 105. These interior surfaces include, but are not limited to, the shield ring 140, the plasma chamber walls 107, the dielectric window 125, the gas baffle 175 and other surfaces.

When the conditioning process is complete, a layer or multiple layers of the desired dopant have been deposited on the interior surfaces of the plasma chamber 105. In certain embodiments, the thickness of the coating deposited on the interior surface may be as thick as tens to hundreds of microns. It is this deposition that is used as the solid source of dopant for the subsequent implant process. Stated differently, the conditioning process serves to deposit the dopant species, in solid form, on the interior surfaces of the plasma chamber 105. This solid form of the dopant species will subsequently be implanted into the workpiece.

The duration of time for the conditioning process may vary, and may be several seconds or several minutes, although other durations may also be employed. In other embodiments, closed loop control of the coating thickness may be employed. For example, a quartz crystal microbalance may be used to determine when the desired thickness of the coating has been achieved.

After the conditioning process, a deposition process is performed. For the deposition process, a working gas is introduced into the plasma chamber 105. This working gas may be stored in a separate container from the feedgas and may enter the plasma chamber 105 via the gas baffle 175, or via a different inlet.

Unlike traditional deposition and implant processes, the working gas that is introduced into the plasma chamber 105 during the deposition and implant processes does not contain the dopant species. The working gas may be a species that is useful to remove the solid dopant from the interior surfaces of the plasma chamber 105. Some examples of a suitable working gas include inert gasses, such as argon, neon, helium, krypton, and xenon. Other suitable working gasses may include helium, germane, and others. Of course, other species may also be used as the working gas.

As was done during the conditioning process, the RF antenna 120 is energized using the RF power supply 121, so as to create a plasma 180 in the plasma chamber 105. During an initial period, referred to as the plasma stabilization period or the "pre-implant plasma on time", the platen 130 is not negatively biased by the bias power supply 135. However, the plasma 180 serves to sputter the previously deposited coating on the interior surfaces of the plasma chamber 105. Some of the sputtered material becomes part of the plasma 180. Some of the sputtered material is deposited on the workpiece 10. As stated above, the sputtered material contains the desired dopant species in solid form.

Figure 2:
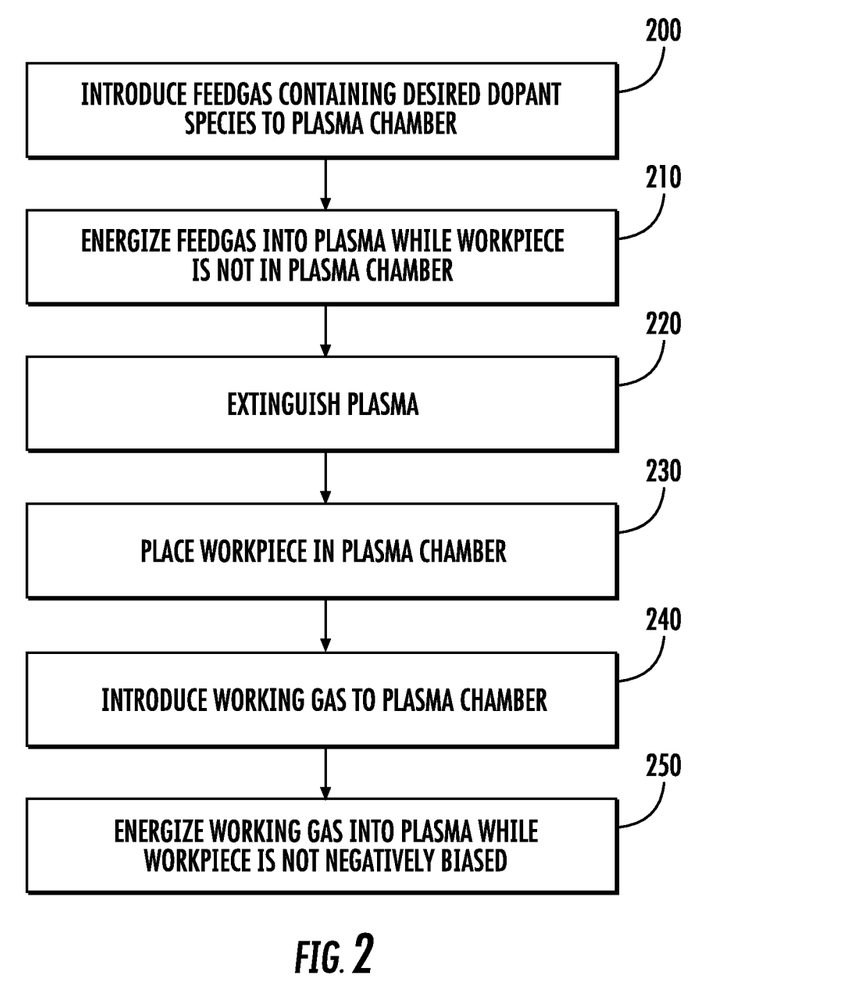
FIG. 2 is a representative flowchart showing the conditioning and deposition processes.

This sequence of processes, which results in sputtered material containing the desired dopant species in solid form being deposited on the workpiece 10, is shown in FIG. 2. First, as shown in Process 200, a feedgas containing the desired dopant is introduced into the plasma chamber 105. This feedgas is energized into a plasma, as shown in Process 210. This occurs while the workpiece is not disposed in the plasma chamber 105. In Process 210, a coating, which contained the desired dopant, is deposited on the interior surfaces of the plasma chamber 105. When a sufficient amount of coating has been deposited on the interior surfaces, the plasma is extinguished, as shown in Process 220. The coating that was deposited during Process 210 will be the source of solid dopant that will be implanted into the workpiece during the subsequent processes. Processes 200-220 are all part of the conditioning process.

After the plasma has been extinguished, the workpiece 10 that is to be implanted is placed in the plasma chamber 105, as shown in Process 230. After the workpiece 10 has been placed, the working gas is introduced into the plasma chamber 105, as shown in Process 240. As noted above, the working gas does not contain the desired dopant to be implanted. The working gas is then energized into a plasma while the workpiece 10 is not negatively biased, as shown in Process 250. During this period, referred to as the "pre-implant plasma on time", the energetic ions in the plasma serve to sputter the coating from the interior surfaces of the plasma chamber 105. Some of this coating falls onto the workpiece 10. Thus, the sequence shown in Processes 230-250 of FIG. 2 represents a method to deposit the desired dopant, which previously coated the interior surfaces of the plasma chamber 105, on a workpiece.

Thus, in certain embodiments, the deposition of the dopant species occurs when the workpiece is not negatively biased, and the working gas being introduced into the plasma chamber does not comprise the dopant species. Further, as described above, the source of the dopant species that is deposited is in solid form, having previously formed a coating on the interior surfaces of the plasma chamber. The thickness of the dopant species that is deposited on the workpiece may vary. In certain embodiments, it may comprise one or more monolayers, although other thicknesses may be employed, depending on the desired dopant concentration.

Figure 3A:
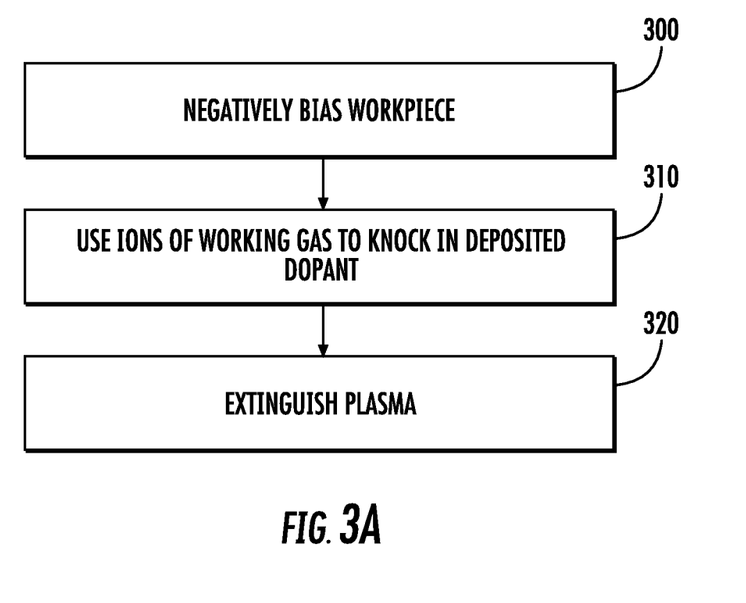
FIGS. 3A-3C show flowcharts of implant processes according to different embodiments.
Figure 3B:
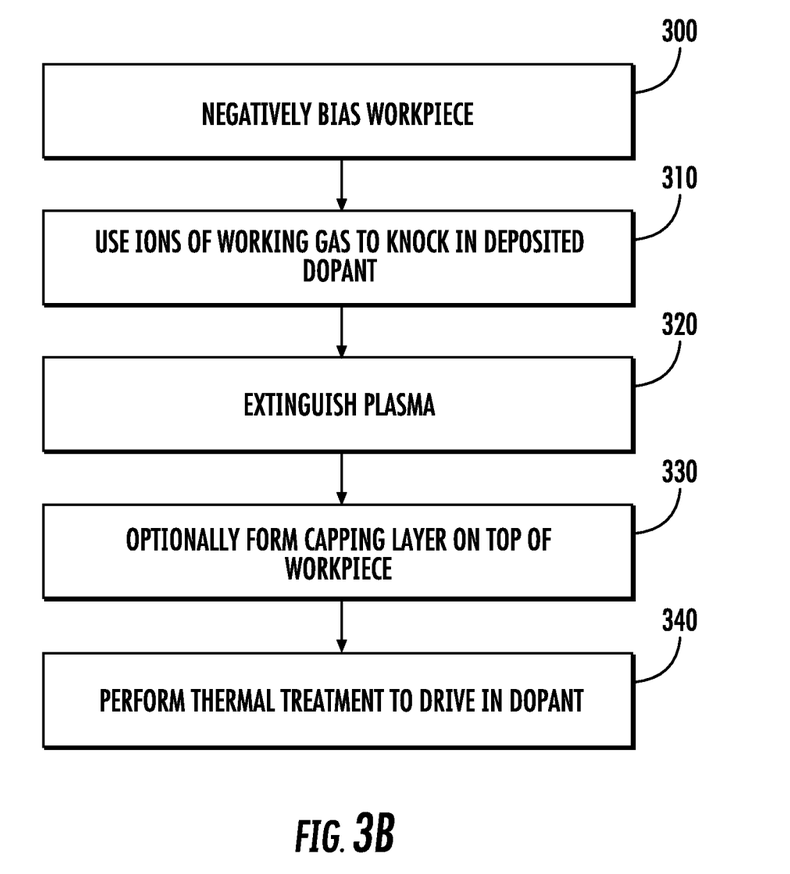
Figure 3C:
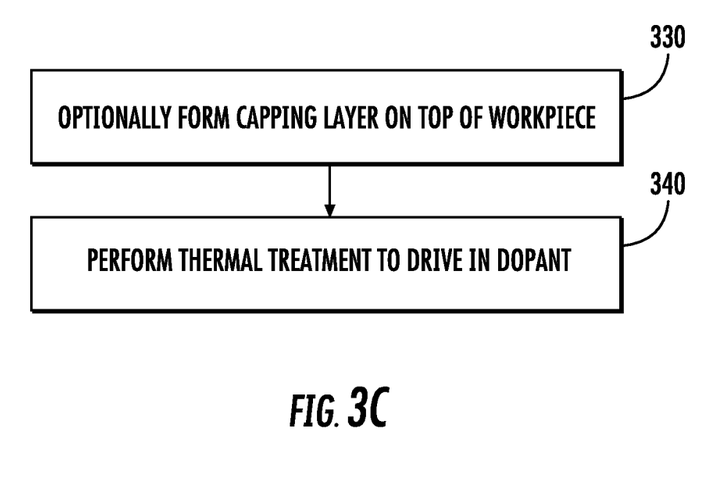

Once the desired dopant has been deposited on the workpiece 10, there are several ways which that the dopant may be implanted in the workpiece 10. FIGS. 3A-3C show several different implantation processes. It is understood that these implantation processes are illustrative and other implantation processes may also be used.

FIG. 3A shows a first sequence that may be used to implant the desired dopant in the workpiece. In this embodiment, the working gas is still being introduced into the plasma chamber 105, and the working gas continues to be energized. To perform the implant process, the platen 130 is negatively biased so as to attract the positive ions in the plasma 180 toward the workpiece 10, as shown in Process 300. These positive ions serve to knock in the desired dopant that was previously deposited on the surface of the workpiece 10, as shown in Process 310. This process may last one or more seconds, depending on the desired dose. After this is completed, the plasma is extinguished, as shown in Process 320. The workpiece 10 may then be removed from the plasma chamber 105. In this embodiment, all of the processes illustrated in FIGS. 2 and 3A are performed in a single plasma chamber 105. Thus, the ions used to knock in the deposited dopant are created from the working gas and do not include the dopant species.

FIG. 3B shows a second sequence that may be used to implant the dopant in the workpiece. In this embodiment, the knock in mechanism of FIG. 3A is performed, as shown in Processes 300-320. After this, a capping layer may optionally be formed on the top surface of the workpiece 10, as shown in Process 330. This capping layer may comprise an oxide layer, a nitride layer, or any other suitable layer. In other embodiments, a capping layer is not formed on the workpiece 10. The workpiece 10 is then exposed to a thermal treatment, as shown in Process 340, which serves to drive in the dopant into the workpiece. The formation of the capping layer and the thermal treatment may be performed in a different process chamber than Processes 200-250 and Processes 300-320, if desired.

FIG. 3C shows a third sequence that may be used to implant the dopant in the workpiece. In this embodiment, the knock in mechanism of FIGS. 3A and 3B is not performed. Rather, the optional formation of the capping layer, as shown in Process 330 and the thermal treatment, as shown in Process 340, are performed. These processes may be performed in a different process chamber than Processes 200-250, if desired.

The thermal treatment shown in Process 340 may be any convention thermal treatment, include an anneal process, a laser anneal, a flash anneal, or any other suitable process.

FIG. 2 and the implant processes of FIGS. 3A-3C show the processes that are used to process a single workpiece. If multiple workpieces are to be processed, this may be accomplished in a number of ways. For example, in certain embodiments, a conditioning process is performed for each workpiece that is to be implanted. In other words, Processes 200-250 and an implant process, such as one of those shown in FIGS. 3A-3C, is performed for each workpiece. In another embodiment, the conditioning process may be performed less frequently. For example, Processes 200-220 may only be performed once for every N workpieces that are to be processed. In other words, for the first workpiece, Processes 200-250 are performed, followed by an implant process. For the next N−1 workpieces, Processes 230-250 are performed, followed by an implant process. The value of N is not limited by this disclosure and may be as small as 2 and as large as 100 or more.

In other words, in certain embodiments, the deposition process begins by placing a workpiece in the plasma chamber. A working gas, that does not include the dopant species, is energized into a plasma. This plasma causes the dopant species, which was previously deposited on the interior surfaces of the plasma chamber, to become deposited on the workpiece. This may be performed without negatively biasing the workpiece. This is reflected in Processes 230-250 of FIG. 2. After the dopant species is deposited, it may be implanted in the workpiece using any of the implant processes shown in FIGS. 3A-3C.

The embodiments described in this disclosure may have many advantages. For example, in one embodiment, low dose implants, such as between 5e12 and 5e16 atoms/$cm^2$, may be performed using the processes described herein. In one particular example, a low dose implant of 1e13 atoms/$cm^2$ was performed. Of course, other doses may be implanted by varying the conditioning time, the pre-implant plasma on time, and/or the implant time. The use of dopant in solid form, which previously coated the interior surfaces of the plasma chamber, may allow precise dopant concentrations, especially at low doses.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of depositing a dopant species on a workpiece, comprising:
    performing a conditioning process, the conditioning process comprising:
        introducing a conditioning gas into a plasma chamber of an ion source, the conditioning gas comprising a dopant species; and
        ionizing the conditioning gas in said plasma chamber so as to form a coating, which comprises the dopant species in solid form, on interior surfaces of the plasma chamber; and
    performing a deposition process after the conditioning process, the deposition process comprising:

introducing a working gas into the plasma chamber after the coating is formed, wherein the working gas does not comprise the dopant species; and ionizing the working gas in said plasma chamber to create ions and sputter the coating, such that the dopant species is deposited on the workpiece, wherein the workpiece is disposed in the plasma chamber during the deposition process.

2. The method of claim 1, wherein the workpiece is not disposed in the plasma chamber during the conditioning process.

3. The method of claim 1, wherein the working gas comprises an inert gas.

4. The method of claim 1, wherein the workpiece is not negatively biased during the deposition process such that ions are not accelerated toward the workpiece during the deposition process.

5. A method of implanting a dopant species in a workpiece, comprising:

performing a conditioning process, the conditioning process comprising:

introducing a conditioning gas into a plasma chamber of an ion source, the conditioning gas comprising a dopant species; and ionizing the conditioning gas in said plasma chamber so as to form a coating, which comprises the dopant species in solid form, on interior surfaces of the plasma chamber;

depositing the dopant species on the workpiece by sputtering the coating, wherein the workpiece is disposed in the plasma chamber during the depositing and the workpiece is not negatively biased during the depositing; and implanting the dopant species that is deposited on the workpiece into the workpiece.

6. The method of claim 5, wherein the implanting comprises exposing the workpiece to a thermal treatment.

7. The method of claim 6, wherein a capping layer is deposited on the workpiece prior to the exposing.

8. The method of claim 5, wherein the sputtering comprises:

introducing a working gas into the plasma chamber after the coating is formed, wherein the working gas does not comprise the dopant species; and ionizing the working gas in said plasma chamber to create ions and sputter the coating, such that the dopant species is deposited on the workpiece.

9. The method of claim 8, wherein the implanting comprises negatively biasing the workpiece so as the cause ions of the working gas to drive in the dopant species.

10. The method of claim 9, further comprising exposing the workpiece to a thermal treatment after the negatively biasing.

11. The method of claim 10, wherein a capping layer is deposited on the workpiece after the negatively biasing and prior to the exposing.

12. The method of claim 8, wherein the working gas comprises an inert gas.

13. A method of processing a workpiece, comprising:

placing a workpiece in a plasma chamber; and creating a plasma by energizing a working gas in the plasma chamber while the workpiece is disposed in the plasma chamber; and performing a deposition process, wherein the plasma causes dopant species that coated interior surfaces of the plasma chamber to sputter and deposit on the workpiece, wherein the working gas does not comprise the dopant species and the workpiece is not negatively biased during the deposition process.

14. The method of claim 13, wherein the working gas comprises an inert gas.

15. The method of claim 13, further comprising implanting the dopant species that is deposited on the workpiece.

16. The method of claim 15, wherein the implanting comprises exposing the workpiece to a thermal treatment.

17. The method of claim 16, wherein a capping layer is deposited on the workpiece prior to the exposing.

18. The method of claim 15, wherein the implanting comprises negatively biasing the workpiece so as the cause ions of the working gas to drive in the dopant species.

19. The method of claim 18, further comprising exposing the workpiece to a thermal treatment after the negatively biasing.

20. The method of claim 19, wherein a capping layer is deposited on the workpiece after the negatively biasing and prior to the exposing.

* * * * *